United States Patent
Takahashi et al.

(12)

(10) Patent No.: US 6,313,653 B1
(45) Date of Patent: Nov. 6, 2001

(54) IC CHIP TESTER WITH HEATING ELEMENT FOR PREVENTING CONDENSATION

(75) Inventors: Hiroyuki Takahashi; Akio Kojima; Toshiyuki Kiyokawa, all of Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/328,499

(22) Filed: Jun. 9, 1999

(30) Foreign Application Priority Data

Jun. 9, 1998 (JP) .................................................. 10-160772
Jul. 17, 1998 (JP) .................................................. 10-203605

(51) Int. Cl.[7] .................................................. G01R 31/02
(52) U.S. Cl. .......................................... 324/760; 324/765
(58) Field of Search .................................. 324/537, 754, 324/760, 765

(56) References Cited

U.S. PATENT DOCUMENTS 4,926,117 * 5/1990 Nevill .................................... 324/760
5,742,168 * 4/1998 Kiyokawa et al. .................. 324/754
5,986,460 * 11/1999 Kawakami ............................ 324/765

* cited by examiner

*Primary Examiner*—Glenn W. Brown
(74) *Attorney, Agent, or Firm*—Birch, Stewart, Kolasch & Birch, LLP

(57) ABSTRACT

An IC chip testing apparatus provided with an IC socket to which an IC chip is brought into electrical contact, a printed circuit board with one terminal which is electrically connected to a terminal of a test head and with another terminal which is electrically connected to a terminal of the IC socket, and a heating element provided at the printed circuit board. The IC chip testing apparatus may be provided with a socket to which an IC chip to be tested is detachably mounted; a socket guide; a chamber opening to which the socket guide is attached so that an IC chip mounting opening of the socket faces inside a chamber which is maintained at a predetermined state less than ordinary temperature; a printed circuit board; and a heating board which is provided around the chamber opening.

7 Claims, 13 Drawing Sheets

IC CHIP TESTER WITH HEATING ELEMENT FOR PREVENTING CONDENSATION

BACKGROUND OF THE INVENTION

1. Field of the Invention

The present invention relates to an electronic device testing apparatus for testing semiconductor integrated circuit devices (hereinafter abbreviated as "ICs") and other electronic devices, more particularly relates to an electronic device testing apparatus able to prevent condensation on the printed circuit board easily occurring during the application of a low temperature and the radiation of heat from a socket easily occurring during the application of a high temperature or low temperature.

2. Description of the Related Art

A handler of an IC chip testing apparatus or other electronic device testing apparatus conveys a large number of IC chips held on a tray into it, brings them into electrical contact with a test head in a state with a high temperature or low temperature thermal stress applied, and has them tested at the IC testing apparatus. When the tests are completed, the IC chips are conveyed out from the test head and reloaded on trays in accordance with the results of the test so as to sort them into categories such as good chips and defective chips.

The handlers of the related art may be roughly classified by type of application of temperature into chamber type handlers which reload IC chips to be tested on a special tray called a "test tray", convey it into a temperature application chamber to bring the IC chips to a predetermined temperature, then push the IC chips against the test head in the state loaded on the test tray and heat plate type handlers which load IC chips on a heat plate (also called a "hot plate") to apply a high temperature thermal stress to them, then pick up several of the IC chips at a time by suction heads and convey them to the test head against which they are pushed.

In both types of handlers, the test head against which an IC chip is pushed is provided with an IC socket having contact pins and one or more printed circuit boards (mother board, daughter boards, subboards, etc.) electrically connected to the IC socket. The printed circuit boards are connected to input-output terminals of the test head. The IC chip is tested by the testing apparatus through the test head.

When applying a high temperature or low temperature thermal stress in a chamber type handler, however, while the IC chip is given a high temperature or low temperature in the chamber, when the IC chip is brought into contact with the IC socket, the heat is dissipated from there and therefore the problem arises of a fluctuation in the applied temperature during the tests. In particular, in a test head of a type directly connected to the IC socket and mother board and other printed circuit boards, the heat conducted to the IC socket is easily radiated to the printed circuit boards. When applying a low temperature thermal stress, further, condensation occurs at the printed circuit boards and therefore there is a danger of detrimental effect on the signal characteristics.

Also in a heat plate type handler, while the IC chip is given a high temperature, when the IC chip is brought into contact with the IC socket, the heat is dissipated from there and therefore the problem arises of a fluctuation in the applied temperature during the tests in the same way.

Also in a test head of a type where a spacing frame is arranged between the IC socket and thee print circuit board, when the IC chip is given an extremely low temperature stress of about −50° C., the low temperature conducts through the coaxial cable and the daughter board connecting the IC socket and the print circuit board and therefore there is a danger that condensation occurs at the printed circuit boards.

Further, in a testing apparatus testing an IC chip inside a chamber in this way, since the chip mounting opening of the socket in which the IC chip is mounted faces inside the chamber and the terminals of the socket are connected to the test head through a printed circuit board outside the chamber (performance board), the structure is one susceptible to entry of outside air behind the socket. Therefore, there is the problem of a susceptibility to condensation at the printed circuit board behind the socket or the test head. If condensed moisture flows to electrical contact portions, there is the danger of causing short-circuits at the electrical wiring. Therefore, condensation must be prevented at all costs.

Accordingly, in the testing apparatuss of the related art, a large distance was set between the socket and the printed circuit boards and a spacing frame or other heat insulating structure was arranged between them to prevent condensation at the printed circuit boards behind the socket and the test head.

If a large distance is set between the socket and the printed circuit boards in this way, however, the electrical path from the socket to the printed circuit boards (electrical cables etc.) becomes longer and noise more easily occurs, so the reliability of the tests is liable to drop. Further, it is not possible to use general purpose printed circuit board holding rings and other parts and it is necessary to prepare special spacing frames and other heat insulating structures, so the manufacturing costs rise.

SUMMARY OF THE INVENTION

A first object of the present invention is to provide an electronic device testing apparatus which can prevent the condensation at the printed circuit boards which easily occurs at the time of application of a low temperature and the radiation of heat from the socket which easily occurs at the time of application of a high temperature or low temperature.

A second object of the present invention is to provide an electronic device testing apparatus which can, by a relatively inexpensive structure, effectively prevent the occurrence of condensation behind a socket where an electronic device is mounted for testing.

To achieve the first object of the present invention, according to a first aspect of the present invention, there is provided an electronic device testing apparatus comprising a socket to which an electronic device is brought into electrical contact, a circuit board with one terminal which is electrically connected to a terminal of a test head and with another terminal which is electrically connected to a terminal of the socket, and a heating element provided at the circuit board.

The heating element is preferably printed on the circuit board.

The printed circuit board is preferably provided in proximity to the socket.

In the electronic device testing apparatus of the first aspect of the present invention, since the printed circuit board is provided with a heating element, it is possible to heat the printed circuit board in accordance with the temperature to be applied so as to reduce the temperature gradient between the electronic device and the printed circuit board and therefore suppress radiation of heat from the socket to the printed circuit board. Further, since the heating element also serves as an auxiliary means for application of a high temperature, it is possible to shorten the time for raising the temperature and possible to expect an improvement in the throughput of the electronic device testing apparatus. On the other hand, by heating the printed circuit board at the time of application of a low temperature, it is possible to prevent condensation from occurring at the printed circuit board.

In the present invention, the heating element is not particularly limited in where it is provided, but should at least be provided around the socket when applying a high temperature. This placement is sufficient to keep heat from being conducted to the printed circuit board through the socket. As opposed to this, when applying a low temperature, it is desirable to provide the heating element substantially across the entire area of the printed circuit board. This is because condensation occurs when the ambient temperature drops and such condensation must be prevented across the entire area of the printed circuit board.

In the electronic device testing apparatus of the first aspect of the present invention, the method of provision of the heating element is not particularly limited. A heating unit may be mounted on the printed circuit board or the heating element may be printed on the printed circuit board. As the method of printing the heating element on the printed circuit board, the method of forming a pattern by etching, the method of printing planar nichrome wiring, etc. may be mentioned. By printing the heating element on the printed circuit board, interference etc. with other components connected on the printed circuit board is eliminated and the printed circuit board can be placed even in narrow spaces.

In the electronic device testing apparatus of the first aspect of the present invention, the relative arrangement of the socket and the printed circuit board is not particularly limited. The invention may be applied to not only a test head of the type where the socket is substantially directly connected to the printed circuit board, but also a test head of the type where the socket is connected to the printed circuit board through a socket board, spacing frame, etc. In particular, as explained above, the effect of prevention of radiation of heat and prevention of condensation becomes greater when the printed circuit board is provided in proximity to the socket.

To achieve the second object of the present invention, according to a second aspect of the present invention, there is provided an electronic device testing apparatus comprising a socket to which an electronic device to be tested is detachably mounted; a socket guide holding the socket; a chamber to the opening of which said socket guide is attached so that an electronic device mounting opening of the socket faces inside the chamber and able to maintain the inside at a predetermined state less than ordinary temperature; a circuit board which is electrically connected to a terminal of the socket and which is arranged at the outside of the chamber opening of the chamber; and a heating board which is provided around the chamber opening of the chamber and heats the printed circuit board by heat conduction.

In the present invention, the heating board is not particularly limited, but preferably is a board containing a rubber heater or other planar heating element. Further, the electronic device tested by the testing apparatus of the present invention is not particularly limited, but an IC chip is shown as a preferable example.

The heating board is preferably provided around the chamber opening of the chamber through a mounting base.

The socket guide is preferably detachably mounted to the mounting base.

The circuit board preferably contacts the heating board through a circuit board holding ring so as to form a first air-tight space at the circuit board side of the socket guide. Note that in the present invention, the "air-tight space" is not necessarily a completely air-tight space and may also communicate with the outside through some space. An air-tightness of an extent enabling a dry gas to be sealed in the space is sufficient.

A first seal member is preferably interposed at the portion of contact of the circuit board holding ring and the heating board.

A second seal member is preferably interposed at the portion of contact of the circuit board and the circuit board holding ring.

At the anti-chamber side of the circuit board is preferably attached a reinforcing plate so as to form a second air-tight space with the circuit board and the reinforcing plate is preferably provided with a drying nozzle for feeding dry gas into the second air-tight space. Note that as the dry gas, dry air is preferable.

Preferably, the circuit board is electrically connected through a plurality of movable pins on a movable pin holding ring projecting out in a ring-shape from a test head sending test drive signals to the electronic device mounted at the socket, the reinforcing plate is provided at the inside of the movable pin holding ring, and the second air-tight space formed between the circuit board and the reinforcing plate is made air-tight by a seal ring provided at the inside of the movable pin holding ring.

The circuit board may be brought in contact with the heating board through a seal member so as to form a first air-tight space at the circuit board side of the socket guide.

The heating board is preferably formed with a drying passage for feeding dry gas into the first air-tight space.

In the electronic device testing apparatus according to the second aspect of the present invention, since a heating board is provided around the chamber opening of the chamber with an inside cooled to a temperature less than ordinary temperature and the printed circuit board is heated by heat conduction, the printed circuit board positioned behind the socket is heated to a temperature above the dew point of the ambient gas. Therefore, it is possible to effectively prevent the occurrence of condensation at the printed circuit board behind the socket and the test head.

Further, in the electronic device testing apparatus according to the second aspect of the present invention, since no special spacing frame or other heat insulating structure is employed, it is possible to use general purpose printed circuit board holding rings and other parts and the manufacturing costs become lower. Further, since it is no longer necessary to separate the printed circuit board and the socket by more than the necessary amount of distance, the electrical path from the socket to the printed circuit board (electrical cables etc.) can be shortened, greater resistance to noise can be obtained, and the reliability of the tests can be improved.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

Further, in the present invention, by attaching a reinforcing plate at the anti-chamber side of the printed circuit board so as to form a second air-tight space with the printed circuit board and attaching to the reinforcing plate a drying nozzle for feeding dry gas into the second air-tight space, the second air-tight space can also be filled with a dry gas. This enables condensation behind the printed circuit board as well to be further effectively prevented.

BRIEF DESCRIPTION OF THE DRAWINGS

These and other objects and features of the present invention will become more apparent from the following description of the preferred embodiments given with reference to the attached drawings which are given by way of illustration only, and thus are not limitative of the present invention, and in which.

DESCRIPTION OF THE PREFERRED EMBODIMENTS

Preferred embodiments of the present invention will be discussed in detail below:

First Embodiment

Figure 1:
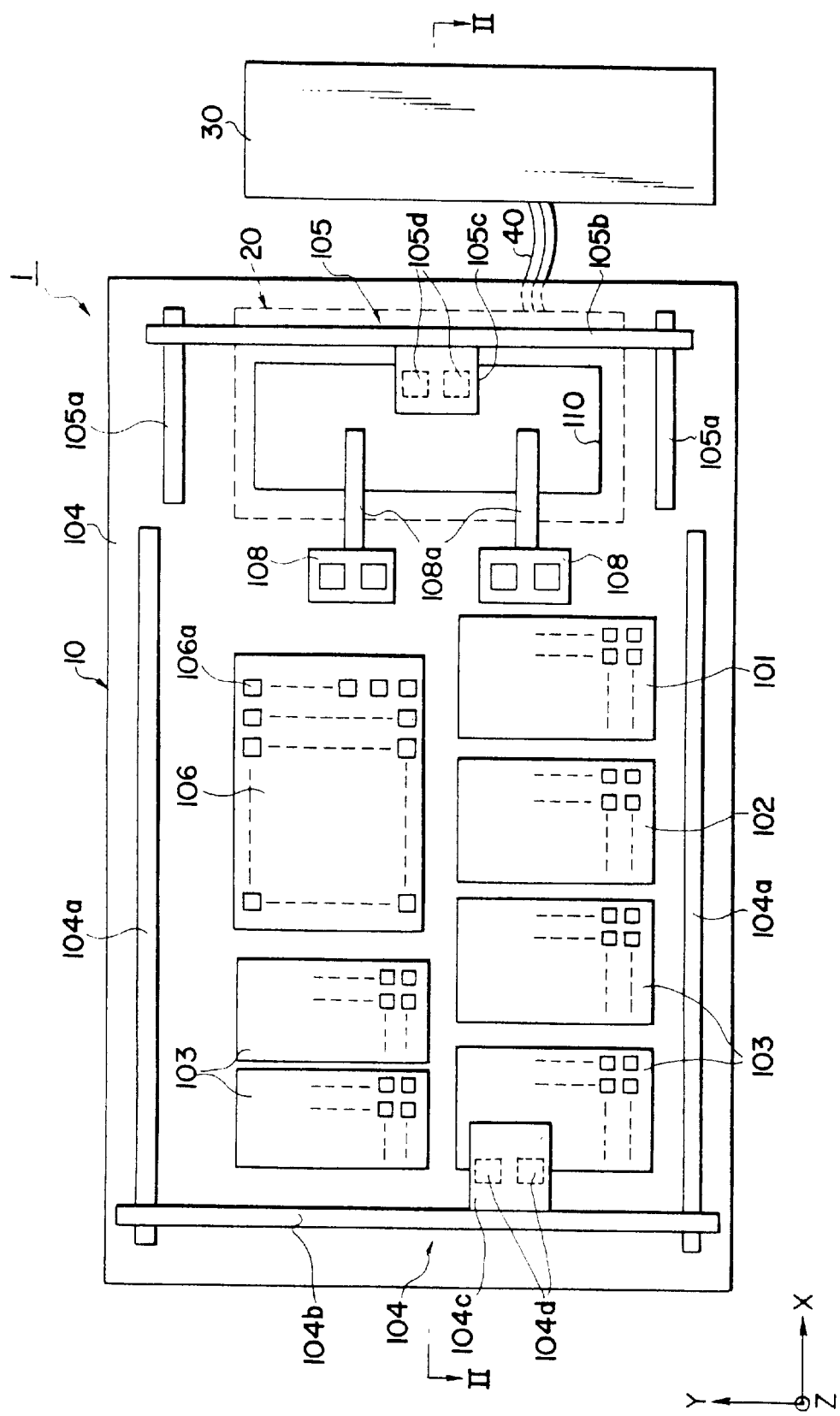
FIG. 1 is a plan view of an IC chip testing apparatus according to a first embodiment of the present invention.

As shown in FIG. 1, the IC chip tester apparatus 1 corresponding to the electronic device tester apparatus of the present embodiment is comprised of a handler 10, test head 20, and tester 30. The test head 20 and the tester 30 are connected via a cable 40. The pre-test IC chips carried on a feed tray 102 of the handler 10 are pushed against the contact sections of the test head 20 by X-Y conveyors 104, 105, the IC chips are tested through the test head 20 and the cable 40, and then the IC chips finished being tested are placed onto sorting trays 103 in accordance with the results of the tests.

Figure 2:
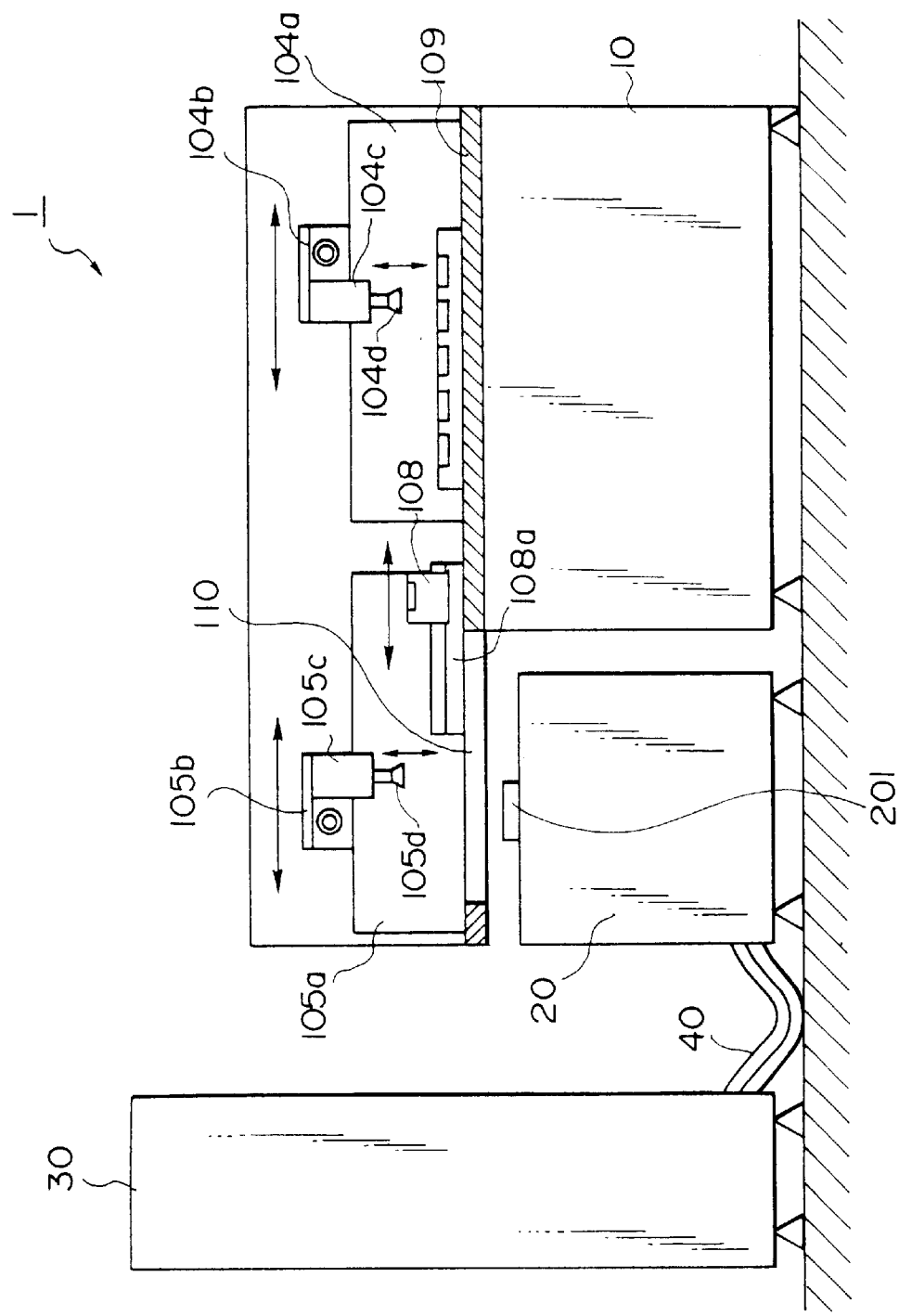
FIG. 2 is a sectional view along the line II—II of FIG. 1.

The handler 10 is provided with a board 109. On the board 109 are provided conveyors 104, 105 for the IC chips to be tested, explained later. The board 109 further is formed with an opening 110. As shown in FIG. 2, IC chips are pushed against contact sections 201 of the test head 20 arranged behind the handler 10 through this opening 110.

The board 109 of the handler 10 is provided with two X-Y conveyors 104, 105. Among these, the X-Y conveyor 104 is configured to be able to move a movable head 104c from a region of the sorting trays 103 to feed trays 102, empty trays 101, the heat plate 106, and two buffer sections 108, 108 by rails 104a, 104b provided along its X-direction and Y-direction. Further, the movable head 104c is designed to be able to be moved in the Z-direction (that is, the vertical direction) by a not shown Z-axial actuator. Two IC chips to be tested can be picked up, conveyed, and released at one time by two suction heads 104d provided at the movable head 104c.

As opposed to this, the X-Y conveyor 105 is configured to be able to move a movable head 105c between the two buffer sections 108, 108 and the test head 20 by rails 105a, 105b provided along its X-direction and Y-direction. Further, the movable head 105c is designed to be able to be moved in the Z-direction (that is, the vertical direction) by a not shown Z-axial actuator. Two IC chips can be picked up, conveyed, and released at one time by two suction heads 105d provided at the movable head 105c.

The two buffer sections 108, 108 move back and forth between the operating regions of the two X-Y conveyors 104, 105 by the rails 108a and not shown actuators. The buffer section 108 at the top in the figure works to convey IC chips conveyed from the heat plate 106 to the test head 20, while the buffer section 108 at the bottom works to eject the IC chips finished being tested at the test head 20. The provision of these two buffer sections 108, 108 enables the two X-Y conveyors 104, 105 to operate simultaneously without interfering with each other.

In the operating region of the X-Y conveyor 104 are provided a feed tray 102 on which IC chips to be tested are loaded, four sorting trays 103 on which tested ICs are stored sorted into categories according to the test results, and an empty tray 101. Further, a heat plate 106 is provided at a position in proximity to the buffer section 108.

The heat plate 106 is for example a metal plate and is formed with a plurality of indentations into which IC chips are dropped. Pre-test IC chips from the feed tray 102 are transferred to the indentations 106a by the X-Y conveyor 104. The heat plate 106 is a heat source for applying a predetermined thermal stress to the IC chips. The IC chips are heated to a predetermined temperature by the heat plate 106, then pushed against the contact sections of the test head 20 through one of the buffer sections 108.

Figure 3:
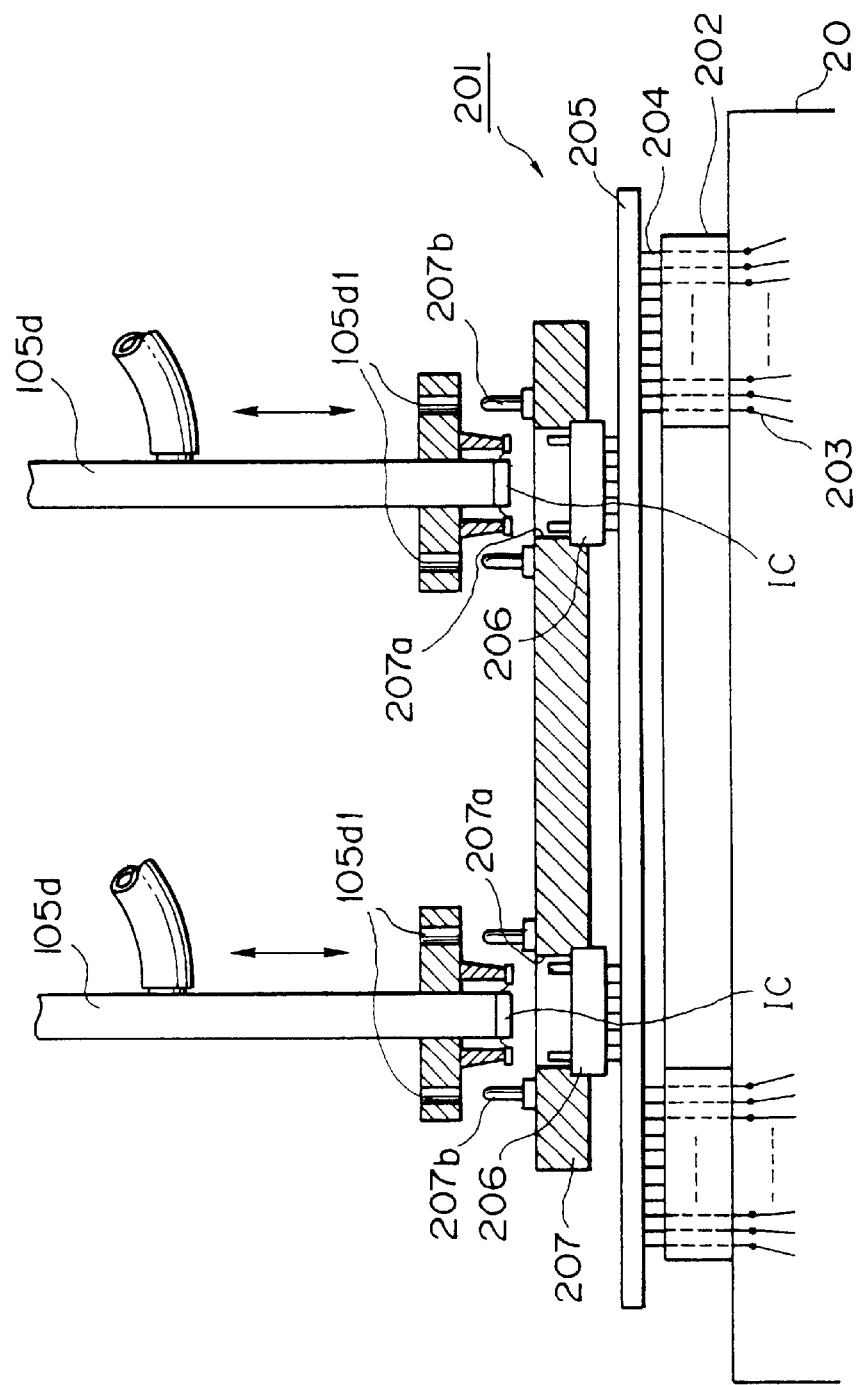
FIG. 3 is a sectional view showing details of a contact section of a test head of FIG. 2.

The top (contact sections 201) of the test head 20 according to the present embodiment, as shown in FIG. 3, is provided with frog rings 202 electrically connected to the test head 20 through cables 203. Each of the frog rings 202 has a plurality of pogo pins 204 (contact pins having movable pins supported to be able to advance and retract in the axial direction by springs and biased in a direction where the movable pins project out by the springs) provided facing upward in a ring. A performance board 205 is provided with terminals contacting the pogo pins 204. Further, two IC sockets 206, 206 are mounted to the top of the performance board 205 (corresponding to the printed circuit board according to the present invention) in an electrically connected state. Due to this, the contact pins (not shown) of the IC sockets 206 are electrically connected to the test head 20 body through the performance board 205, pogo pins 204, frog rings 202, and cables 203.

Figure 4:
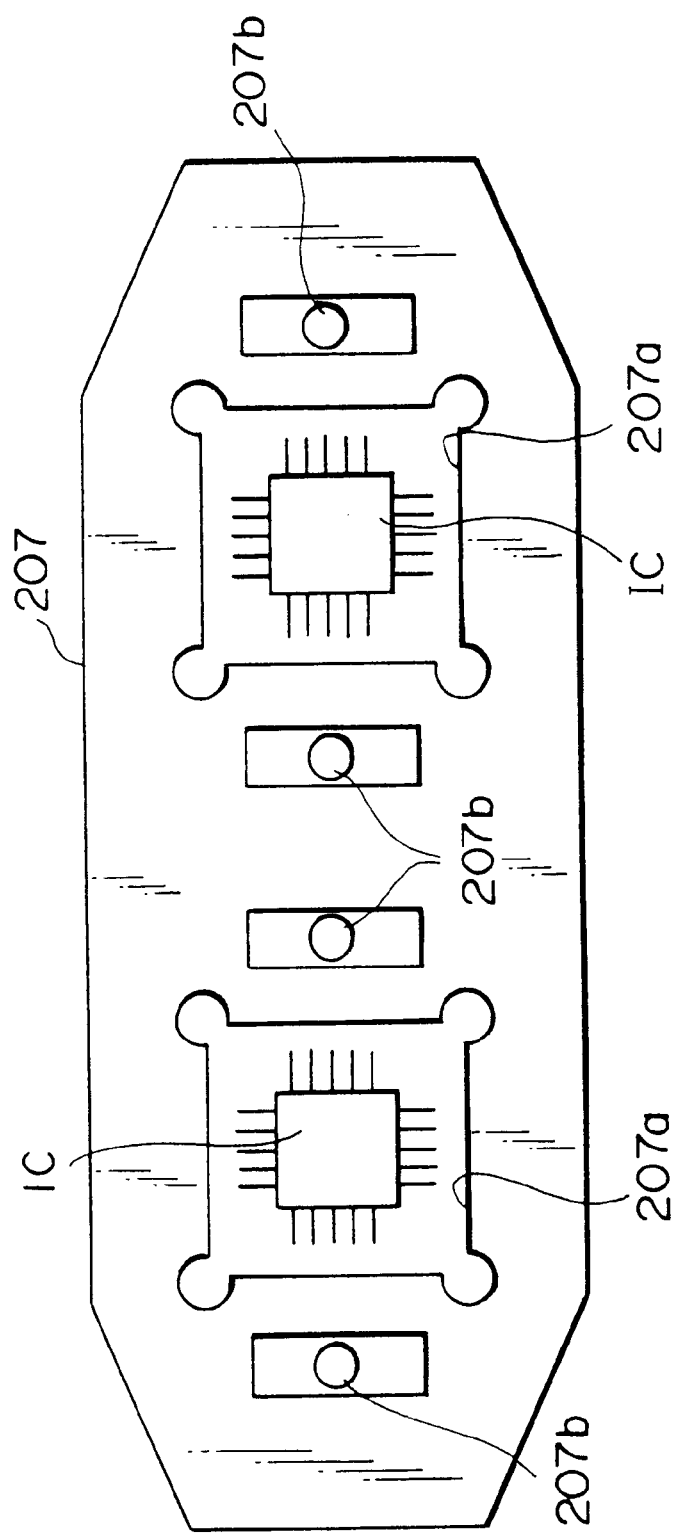
FIG. 4 is a plan view of a socket guide of FIG. 3.

Note that each of the two IC sockets 206 has fitted into it a socket guide 207 having an opening 207a and guide pins 207b as shown in FIG. 4 and that an IC chip held by a suction head 105d is pushed against an IC socket 206 through the opening of the socket guide 207. At this time, the guide pins 207b provided at the socket guide 207 are inserted into the guide holes 105d1 formed in the suction head 105d, whereby the IC chip and IC socket 206 are positioned with respect to each other.

Figure 5:
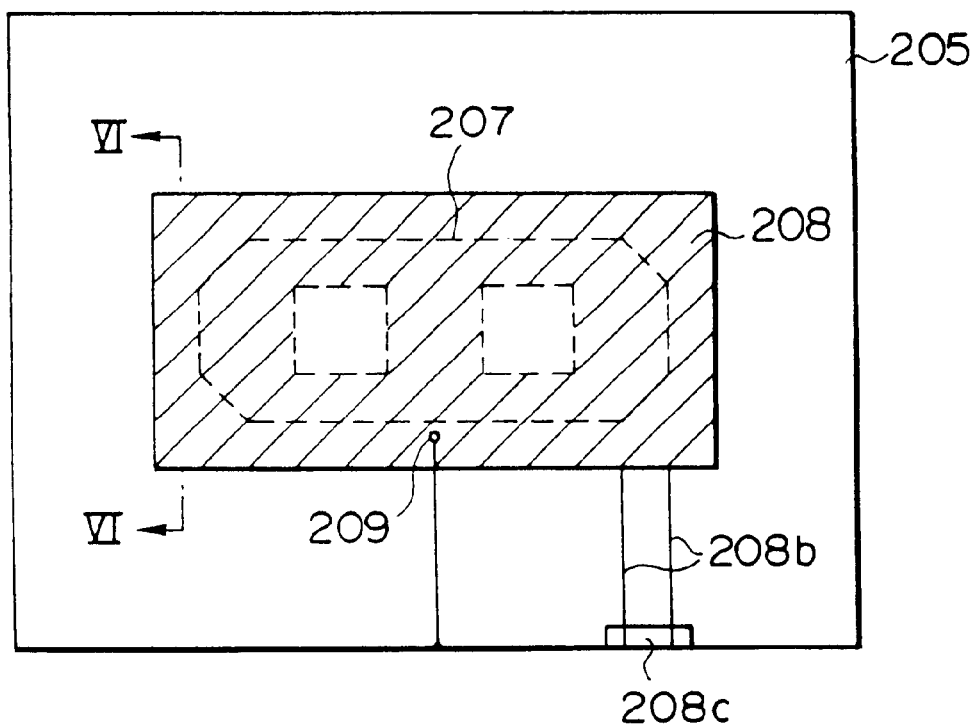
FIG. 5 is plan view of a performance board of FIG. 3.
Figure 6:
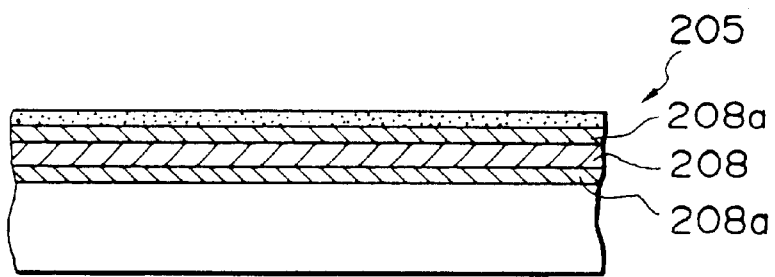
FIG. 6 is a sectional view along the line VI—VI of FIG. 5.

In particular, the performance board 205 according to the present embodiment, as shown in FIG. 5 and FIG. 6, is provided with a heating element 208 in the area around where an IC socket 206 or socket guide 207 is attached. The heating element 208, as shown in FIG. 6, may be formed as any layer in the multiple layer structure of the printed circuit board comprising the performance board 205. In the figure, a heating element layer 208 is formed at the top surface of the performance board 205 and ground layers 208a, 208a are formed above and below it. By providing the ground layers 208a, it is possible to suppress noise from occurring from the heating element layer 208. The ground layers 208a, however, are not essential to the present invention.

The heating element layer 208 may be provided at the performance board 205 comprised of a printed circuit board by forming a pattern of the heating element by etching and also by forming nichrome wiring planarly or other methods of mounting heating elements. Whatever the case, wiring for carrying a current becomes necessary, so in the example shown in FIG. 5, a power supply wiring 208b is formed to the edge of the performance board 205 and a connector 208c is formed there. The specific technique is not limited in any way. Other means may also be employed.

Further, in the present embodiment, a temperature sensor 209 is provided at any location in the area where the heating element 208 is provided so as to manage the temperature of the heating element 208. By incorporating the temperature information from the temperature sensor 209, problems such as overheating or underheating are prevented. The control of the temperature of the heating element 208, however, does not have to be precise. Rough control to the extent of controlling the supply of the power to the heating element 208 is sufficient. At this time, the power may be supplied by the inverter method so as to prevent noise from the heating element 208.

Next, the operation will be explained.

A pre-test IC chip carried on the feed tray 102 of the handler 10 is picked up and held by the X-Y conveyor 104 and transferred to an indentation 106a of the heat plate 106. By leaving it there for exactly a predetermined time, the IC chip rises to a predetermined temperature. Therefore, the X-Y conveyor 104 transferring the not yet heated IC chip from the feed tray 102 to the heat plate 106 releases the IC, then picks up and holds an IC chip which had been left at the heat plate 106 and had been raised to the predetermined temperature and transfers it to a buffer section 108.

The buffer section 108 to which the IC chip has been transferred moves to the right end of the rail 108a, is picked up and held by the X-Y conveyor 105, and, as shown in FIG. 3, is pushed against an IC socket 206 of the test head 20 through the opening 110 of the board 109.

At this time, the heat of the now high temperature IC chip is conducted to the ordinary temperature IC socket 206 and starts to be radiated to the performance board 205 as well, but since the performance board 205 of the present embodiment is provided with the heating element 208 and the area around the IC socket is heated to a suitable temperature, the temperature gradient between the IC chip and the performance board 205 becomes smaller and the amount of heat radiated to the IC socket 205 is suppressed. Therefore, it is possible to test the IC chip at the initially desired temperature and improve the reliability of the test results.

Further, since a drop in the temperature of the IC chip is suppressed by the heating element 208 provided at the performance board 205, it is possible to set the heating temperature at the heat plate 106 low and it is thereby possible to expect a shortening of the time for raising the temperature, that is, improve the throughput of the IC chip testing apparatus 1.

Second Embodiment

Figure 7:
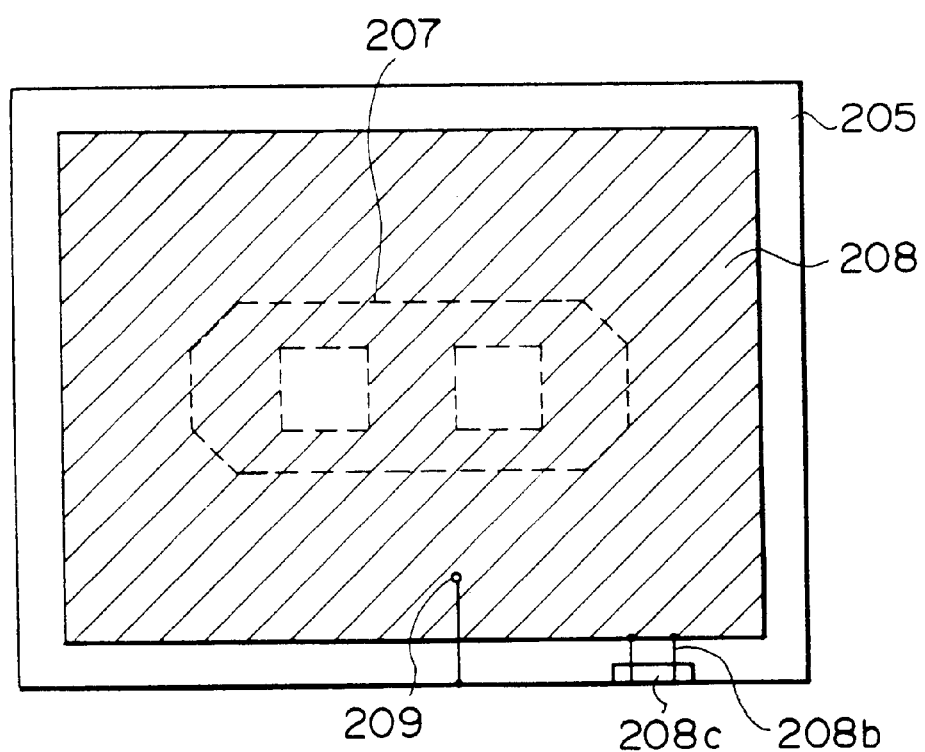
FIG. 7 is a plan view of a performance board of an IC chip testing apparatus according to another embodiment of the present invention.

In the above embodiment, the explanation was given using as an example an IC chip testing apparatus 1 applying a high temperature thermal stress to the IC chip, but the electronic device testing apparatus of the present invention may also be applied to one applying a low temperature thermal stress. FIG. 7 is a plan view (plan view corresponding to FIG. 5) of a performance board according to another embodiment of the IC chip testing apparatus of the present invention.

In this embodiment, the IC chip testing apparatus is one which applies a low temperature thermal stress to the IC chip, then pushes it against an IC socket of the test head and executes the tests. Liquid nitrogen or another low temperature gas is supplied to a region normally near the contact section 201 of the test head 20. In particular, as shown in FIG. 7, the performance board 205 of this embodiment is provided with a heating element 208 over substantially its entire area. The invention is not limited to this, but the heating element 208 of the present embodiment is designed to prevent condensation on the performance board 205, so it is preferable to provide the heating element 208 in the region where the electronic device is provided and not only the area around the IC socket 206.

The structure of the contact section 201 of the test head 20 of the present embodiment is basically the same as that of the embodiment shown in FIG. 3, so will be explained with reference to that figure, but since the IC chip is allowed to stand in this low temperature atmosphere so that the IC chip will fall to the predetermined temperature, this is pushed against an IC socket 206 of the test head 20 for the test.

At this time, the heat of the now low temperature IC chip is conducted to the performance board 205 through the IC socket 206, whereby the air near the surface of the performance board 205 is cooled and condensation starts, but since the performance board 205 of the present embodiment is provided with the heating element 208 and substantially the entire performance board 205 is heated to a suitable temperature, it is possible to prevent the occurrence of condensation.

Figure 8:
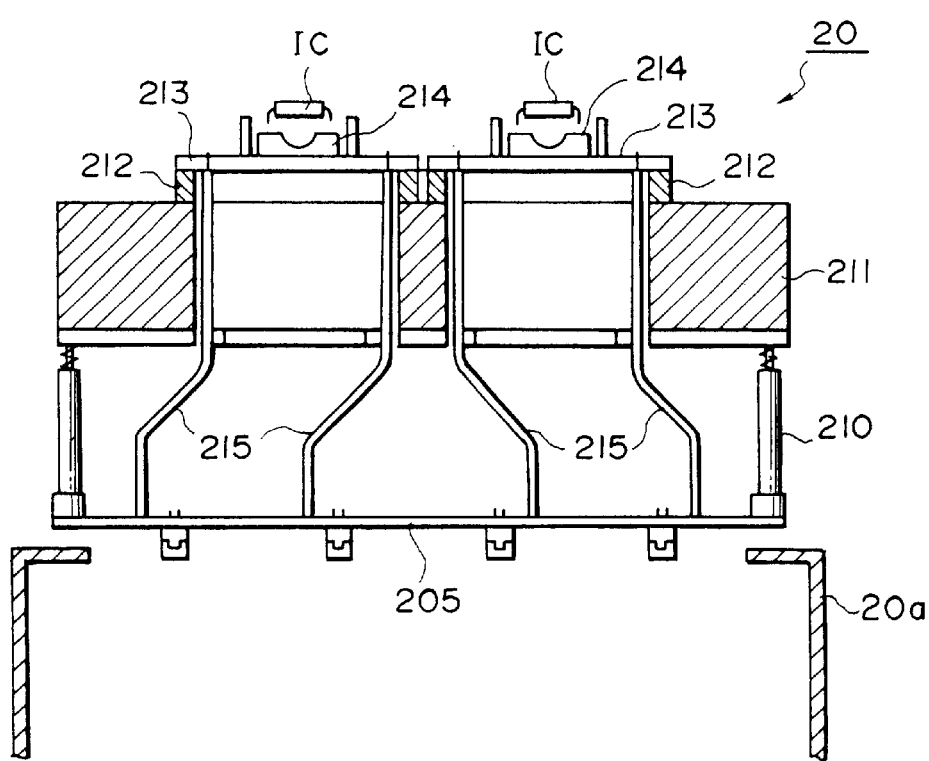
FIG. 8 is a sectional view of a test head of an IC chip testing apparatus according to another embodiment of the present invention.
Figure 9:
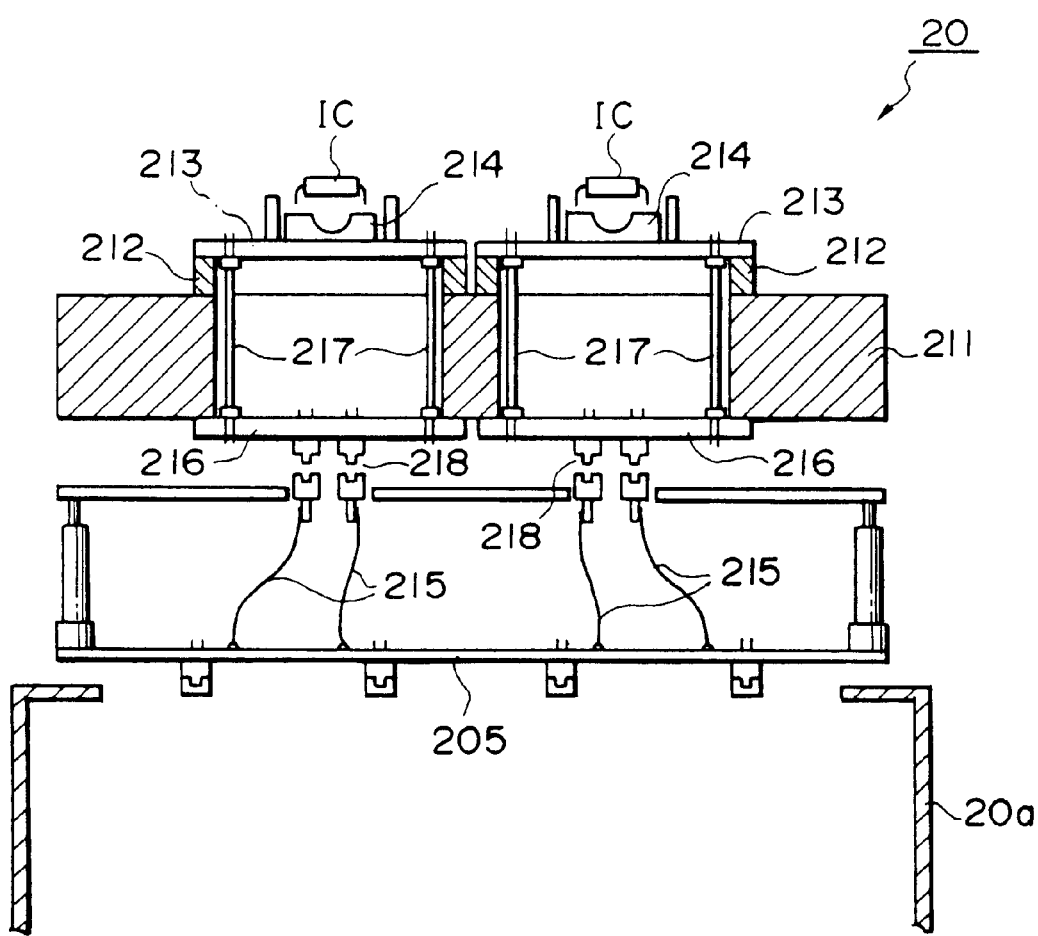
FIG. 9 is a sectional view of a test head of an IC chip testing apparatus according to still another embodiment of the present invention.

Further, the IC chip testing apparatus of the present invention is particularly effective for a test head 20 provided with the IC sockets 206 and performance board 205 in close proximity as in the embodiment shown in FIG. 3, but does not exclude a test head 20 of a type such as shown for example in FIG. 8 or FIG. 9.

In the test head 20 shown in FIG. 8, the performance board 205 (corresponding to printed circuit board of the present invention) is mounted above the test head body 20a. A spacing frame 211 is provided above the performance board 205 via spacer columns 210 able to move vertically somewhat in the Z-direction.

A socket board 213 is provided above the spacing frame 211 through socket board spacers 212. IC sockets 214 are provided on this socket board 213. The performance board 205 and the socket board 213 are connected by a plurality of coaxial cables 215.

As opposed to this, in the test head 20 shown in FIG. 9, a performance board 205 is attached above the test head body 20a. A device specific adapter (DSA) performance board 216 (corresponding to the printed circuit board of the present invention) is provided above the performance board 205 through spacer columns 210 able to move vertically somewhat in the Z-direction. A spacing frame 211 is provided further above this, while a socket board 213 is provided through socket board spacers 212. Further, the DSA performance board 216 and socket board 213 are connected by connector boards 217, while the DSA performance board 216 and base board 209 are connected by a connector 218 and coaxial cables 215.

Even in IC chip testing apparatuss provided with such test heads 20, by provision of the heating elements 208 shown in FIG. 5 to FIG. 7 at the performance board 205 shown in FIG. 8 and the DSA performance board 216 shown in FIG. 9 (even plus the performance board 205), a similar action and effect as in the above embodiment can be exhibited.

Third Embodiment

Figure 10:
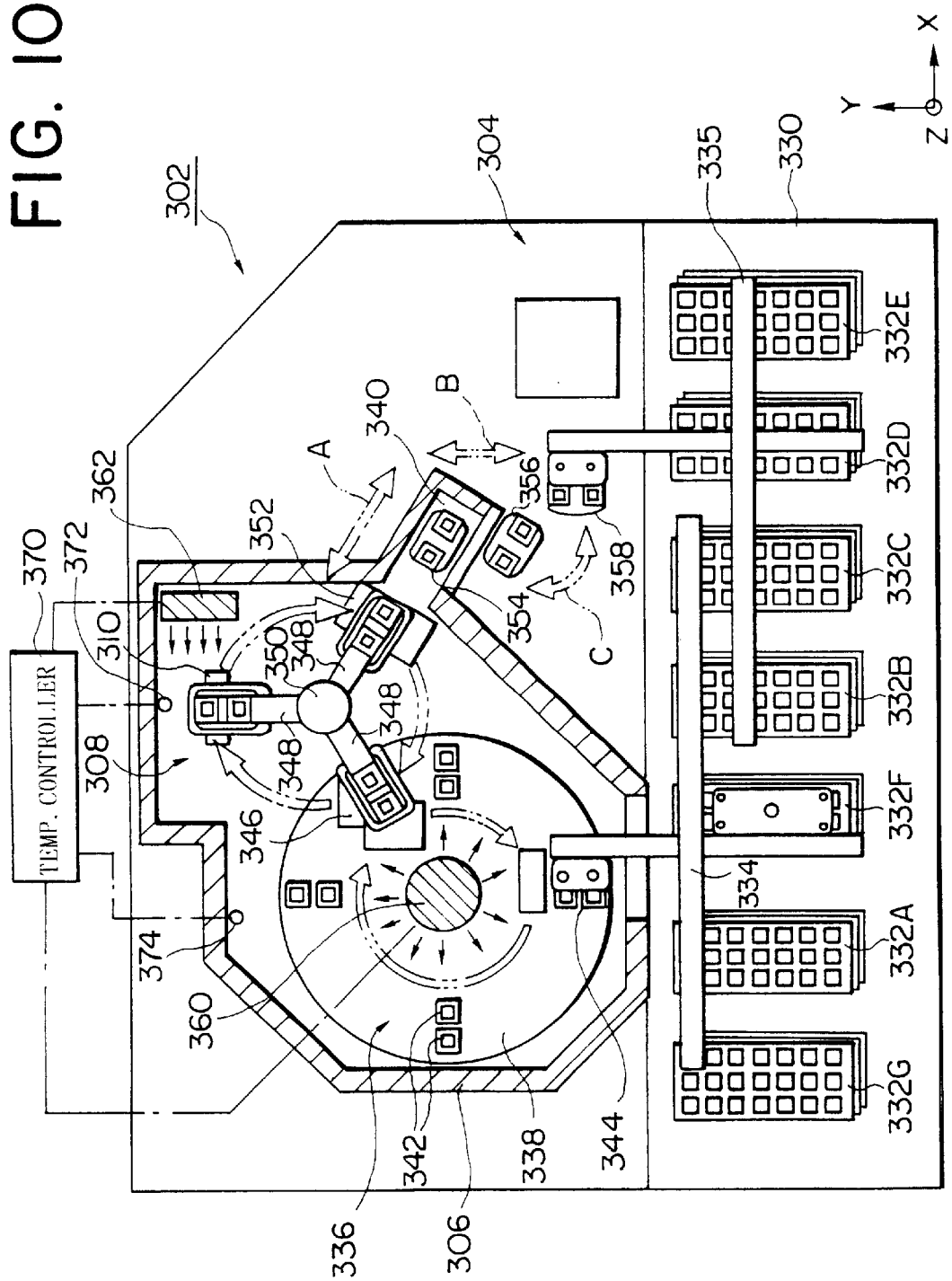
FIG. 10 is a schematic overall view of an IC chip testing apparatus according to a first embodiment of the present invention.

As shown in FIG. 10, the IC chip testing apparatus 302 according to this embodiment is one which tests, as devices to be tested, IC chips in the state of ordinary temperature, low temperature, or high temperature and is provided with a handler 304 and a not shown test use main unit. The handler 304 successively conveys IC chips to be tested to IC sockets provided on the test head and stores the IC chips finished being tested on predetermined trays sorted in accordance with the test results.

Figure 11:
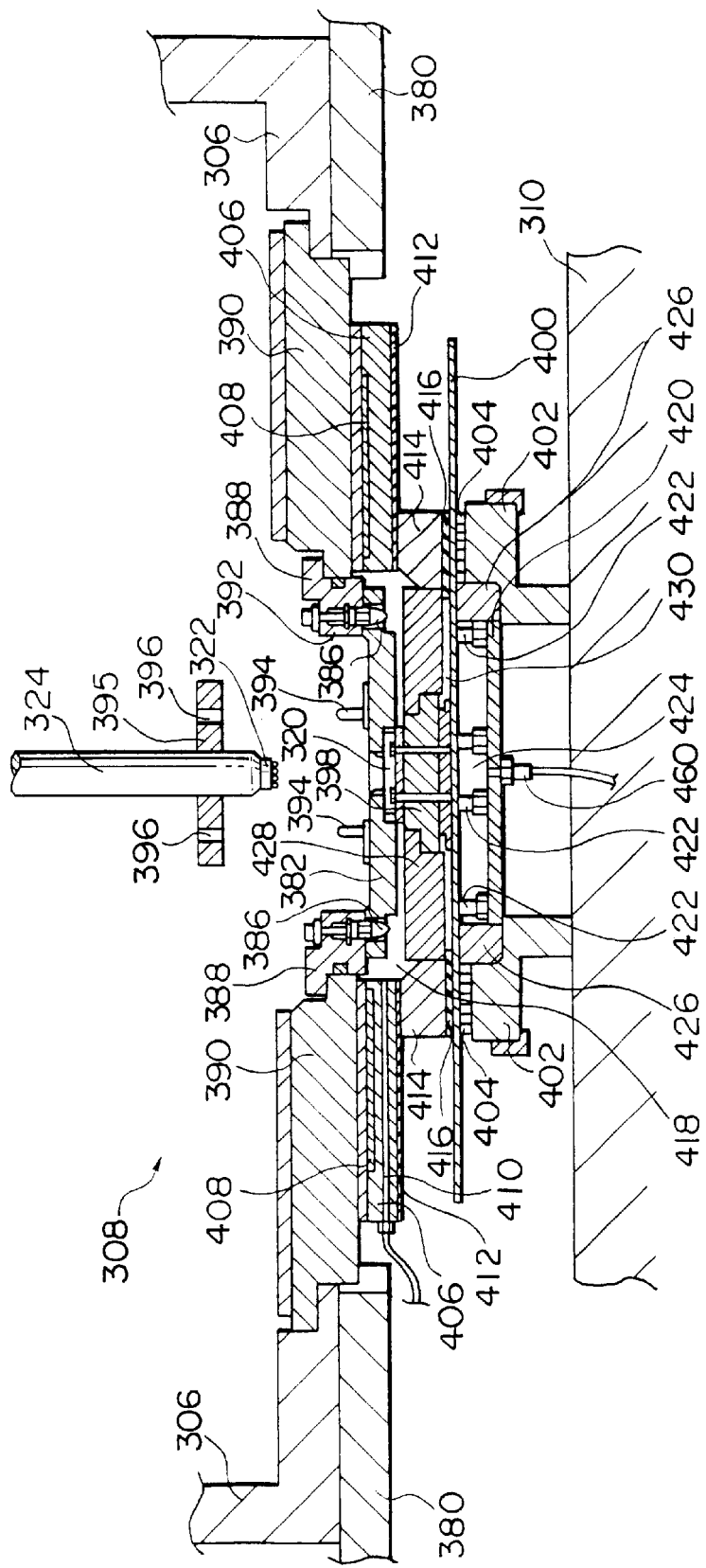
FIG. 11 is a sectional view of key parts of the IC chip testing apparatus.

In this embodiment, the handler 304 is provided with a chamber 306. The top of the test head 310 is exposed at a test stage 308 in the chamber 306. The top of the test head 310 is shown in FIG. 11. Sockets 320 are mounted at the top of the test head 310. The chip mounting openings of the sockets 320 face the inside of the chamber 306 so that IC chips 322 conveyed by the suction heads 324 can be successively detachably mounted.

The IC sockets 320 provided at the test head 310 are connected to the test use main unit (not shown) through cables. The IC chips 322 detachably mounted at the IC sockets 320 are connected to the test use main unit through cables and the IC chips 322 are tested by test signals from the test main unit. The relation among the IC sockets 320 and chamber 306 and the test head 310 will be explained later in detail.

As shown in FIG. 10, the handler 304 has an IC magazine 330 for storing IC chips to be tested and storing tested IC chips sorted into classes. The IC magazine 330 holds loader use trays 332A on which IC chips to be tested are carried, sorting trays 332B to 332E on which tested IC chips are carried sorted into classes, empty trays 332F, and option trays 332G. These trays 332A to 332G are arranged at predetermined intervals along the X-direction and are stacked in the Z-direction (height direction).

IC chips carried on a loader tray 332A are conveyed to a soak stage 336 inside the chamber 306 using the first XY-conveyor 334 attached to the handler 304. Further, IC chips finished being tested at the test head 310 are finally loaded and sorted on the sorting trays 332B to 332E of the IC magazine 330 using the second XY-conveyor 335. Among the sorting trays 332B to 332E, for example, the tray 332C is the tray for good devices, while the other trays are the trays for the defective devices or devices for retesting.

The empty trays 332F are conveyed to and stacked over the sorting trays 332B to 332E which have become filled with the tested IC chips and are used as sorting trays. The option trays 332G are used for other applications.

The inside of the chamber 306 is of an air-tight structure except for the portion for the transfer of IC chips which is designed to be able to open and close by a shutter etc. For example, it can maintain a high temperature state of room temperature to about 160° C. or a low temperature state of room temperature to about −60° C. The inside of the chamber 306 is divided into a soak stage 336, a test stage 308, and an exit stage 340.

The soak stage 336 has a turntable 338 arranged in it. The surface of the turntable 338 has indentations 342 for temporarily holding IC chips arranged at a predetermined pitch along the circumferential direction. In the present embodiment, there are two indentations 343 formed in the radial direction of the turntable 338. The two indentations 342 are arranged at a predetermined pitch in the radial direction. The turntable 338 turns clockwise. The IC chips dropped into the indentations 342 of the turntable 338 at the loading position 344 by the first XY-conveyor 334 are given a thermal stress until the temperature conditions to be tested are reached while the turntable 338 is being indexed in the direction of rotation.

At a takeout position 346 about 240 degrees in the direction of rotation from the loading position 344 based on the center of rotation of the turntable 338, the suction heads attached to one of the three contact arms 348 are positioned above the turntable 338. At that position, IC chips can be taken out from the indentations 342 by the suction heads. The three contact arms 348 are attached at angles of substantially equal amount in the circumferential direction with respect to the shaft 350 and can be indexed 120 degrees at a time in the clockwise direction of rotation about the shaft 350. Note that this "index" means to repeatedly turn by a predetermined angle, then stop, then again turn by a predetermined angle. At the time of this indexing of a contact arm 348, the time when the arm 348 is stopped corresponds to the time during which IC chips are mounted in sockets of the test head 310 and tested plus the time for attachment or detachment of the IC chips to or from the sockets. The stopping time of this indexing is the same as the stopping time of the indexing at the turntable 338. The turntable 338 and the contact arms 348 are indexed synchronously.

In the embodiment, the suction heads of one of the three contact arms 348 are positioned above the takeout position 346 of the soak stage 336, the suction heads of another of the contact arms 348 are positioned above the contact heads 310 of the test stage 308, and the suction heads of the other of the contact arms 348 are positioned above the inlet 352 of the exit stage 340.

The IC chips loaded in the indentations 342 of the turntable 338 at the loading position 344 of the turntable 338 are given a predetermined thermal stress while being indexed from the loading position 344 to the takeout position 346 and are picked up by the suction heads of a contact arm 348 at the takeout position 346. The IC chips picked up by the suction heads are positioned above the test head 310 by the indexing of the contact arm 348 in the clockwise direction. At that position, as shown in FIG. 11, the IC chips 322 picked up and held by the suction heads 324 are attached to the sockets 320 and tested.

The IC chips 322 attached to the sockets 320 above the test head 310 and finished being tested are picked up again by the suction heads 324 and positioned above the inlet 352 of the exit stage 340 by the indexing of the contact arm 348 shown in FIG. 10 in the clockwise direction. At this position, the tested IC chips are slid to the exit position 354 by an exit shifter in the direction of the arrow A. At the exit position of the exit stage 340, the IC chips arranged above the exit shifter are returned from the temperature of the test, that is, the low temperature or the high temperature, to ordinary temperature. In the case of a low temperature test, the IC chips are returned to ordinary temperature at the exit stage 340 so it is possible to effectively prevent condensation from occurring on the IC chips directly after being taken out from the chamber 306.

The IC chips arranged above the exit shifter at the exit position 354 of the exit stage 340 are returned to ordinary temperature, then shifted in the direction of the arrow B by a not shown exit arm and moved to an exit turn arranged at the receiving position 356. The exit turn is designed to be able to move back and forth between the receiving position 356 and the eject position 358 by turning in the direction of the arrow C. The suction heads of the second XY-conveyor 335 are designed to be able to move to the eject position 358 of the exit turn. The tested IC chips arranged at the eject position by the exit turn are conveyed by the conveyor 335 to one of the sorting trays 332B to 332E based on the test results.

In the device testing apparatus 302 according to the present embodiment, a soak stage heat exchanger 360 is arranged at the ceiling of the soak stage 336 inside the chamber 306 of the handler 304 and a test stage heat exchanger 362 is arranged at the side wall of the test stage 308. These heat exchangers 360 and 362 are provided with cooling units using liquid nitrogen etc. as a coolant and blowers for circulating the cold air inside the chamber when the testing apparatus 302 is able to perform low temperature tests. When the testing apparatus 302 is able to perform high temperature tests, the heat exchangers 360 and 362 are provided with heating units and blowers. When the testing apparatus is able to perform low temperature tests and high temperature tests, the heat exchangers 360 and 362 are provided with cooling units, heating units, and blowers and are used switching between the cooling units and heating units. These heat exchangers 360 and 362 are controlled by a temperature controller 370. The temperature controller 370 receives as input output signals from a temperature sensor 372 arranged at the test stage 308, temperature sensor 374 arranged at the soak stage 336, and other sensors and can control the amount of heat exchange (output) of the heat exchangers 360 and 362 in accordance with the output signals from these sensors.

Figure 12:
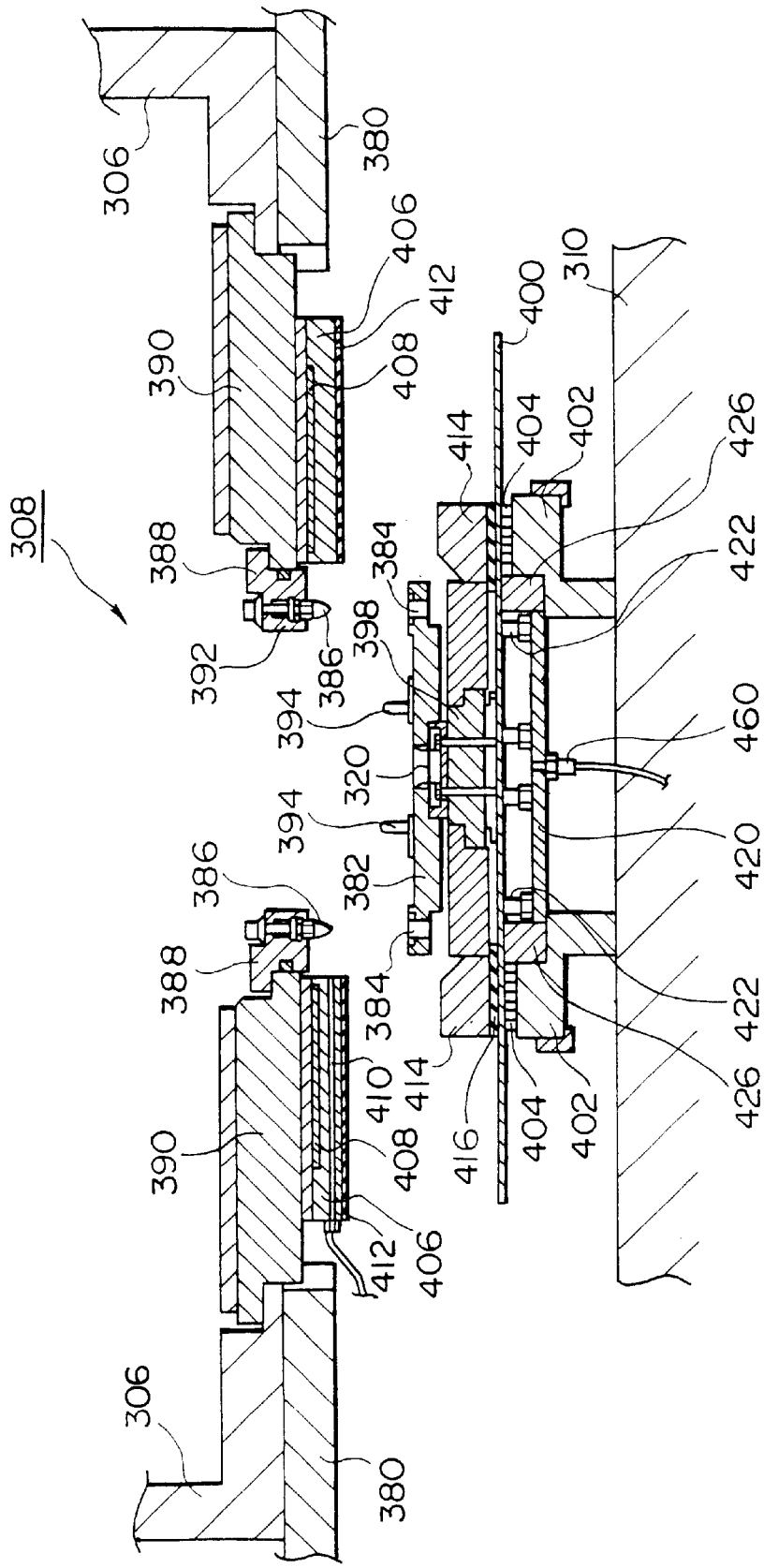
FIG. 12 is a sectional view of key parts showing the state before attachment of the socket guide shown in FIG. 11 to the chamber side.

In the following explanation, the explanation will be given of the case where the testing apparatus 302 is one able to perform both high temperature tests and low temperature tests and the testing apparatus is used mostly for performing low temperature tests. As shown in FIG. 11 and FIG. 12, at the test stage 308, the bottom of the chamber 306 comprised of a heat insulating material etc. and the main base 380 holding the chamber 306 are partially cut away and sockets 320 held on the test head 310 fit there.

The sockets 320 are held by socket guides 382. Each of the socket guides 382, as shown in FIG. 12, has a plurality of guide holes 384. The guide holes 384 are designed to have inserted into them guide rods 386 affixed to the chamber 306 side for positioning with the chamber 306.

The guide rods 386 are attached to a base ring 388. The base ring 388 is affixed to a mounting base 390 and constitutes the chamber opening 392. The mounting base 390 has a heat insulating property similar to that of the chamber 306 and is affixed detachably to the bottom opening of the chamber 306 and the main base 380.

As shown in FIG. 11, the socket guide 382 has a plurality of guide pins 394 attached to it projecting out toward the inside of the chamber 306. The guide pins 394 are inserted into the guide holes 396 of the guide plate 395 attached to a suction head 324 for positioning of the IC chip 322 picked up and held by a suction head 324 and the socket 320.

Behind the socket 320 (outside of chamber) is connected a low temperature use socket adapter 398 which is electrically connected to the terminals of the socket 320. The adapter 398 is affixed to the surface of the substantial center of the printed circuit board 400 and facilitates the electrical connection of the terminals of the socket 320 and the printed circuit board 400. At the bottom surface of the printed circuit board 400 are electrically connected a plurality of movable pins 404 on a movable pin holding ring 402 projecting out in a ring shape from the test head 310. The movable pins 404 are attached to the movable pin holding ring 402 facing upward and are also called pogo pins (contact pins having movable pins supported to be able to advance and retract in the axial direction by springs and biased in a direction where the movable pins project out by the springs). They are pushed against the bottom terminals of the printed circuit board 400 for electrical connection with the printed circuit board 400. Note that the printed circuit board 400 is also called a performance board.

The test head 310 receives drive signals from the test use main unit, not shown, and sends test drive signals to the IC chip 322 attached to the socket 320 through the movable pin holding ring 402, movable pins 404, printed circuit board 400, and adapter 398.

In the present embodiment, as shown in FIG. 11 and FIG. 12, a heating board 406 having an opening at its center is bolted etc. to the bottom surface of the mounting base 390. The heating board 406 is also called an HIFIX heater and comprised of a rubber heater or other planar heating element 408 sandwiched between aluminum sheets etc. At the bottom surface of the heating board 406 is affixed in advance a first seal member 412. The first seal member 412 is configured for example as a silicone sponge rubber sheet or other sheet having elasticity. The top surface of the printed circuit board holding ring 414 detachably contacts the bottom surface of the inner circumference side of the heating board 406 through the first seal member 412 which seals the space between them. Further, the second seal member 416 is attached between the printed circuit board holding ring 414 and the printed circuit board 400 and seals the space between them. The second seal member 416 is comprised of a synthetic resin sheet the same as or different from that of the first seal member 412.

As a result of the sealing by the first seal member 412 and the second seal member 416, a first air-tight space 418 is formed at the printed circuit board side of the socket guide 382. This first air-tight space 418 has communicated with it a radial drying passage 410 formed in the heating board 406. Dry gas can be filled into the first air-tight space 418 from there. As the dry gas for being filled inside the first air-tight space 418, for example dry air having a condensation temperature lower than the temperature inside the chamber 306 may be used. For example, when the inside of the chamber 306 is about −55° C., the condensation temperature of the dry air sealed inside the first air-tight space 418 through the drying passage 410 is preferably about −60° C. The temperature of the dry air is for example about room temperature.

As shown in FIG. 11 and FIG. 12, the printed circuit board holding ring 414 is arranged at a position corresponding to the position of the movable pins 404 contacting the bottom terminals of the printed circuit board 400. The top surface of the holding ring 414 contacts the bottom surface of the heating board 406 to push the printed circuit board 400 downward and secure the electrical contact with the movable pins 404 and printed circuit board 400.

A reinforcing plate 420 is attached to the bottom surface of the center portion of the printed circuit board 400 (anti-chamber side) through a plurality of spacers 422. The reinforcing plate 420 is for preventing the printed circuit board 400 from bending and is positioned inside of the movable pin holding ring 402. A second air-tight space 424 is formed between the reinforcing plate 420 and the printed circuit board 400 by attaching a ring-shaped third seal member 426 between the outer circumference of the reinforcing plate 420 and the inner circumference of the movable pin holding ring 402. This third seal member 426 is comprised of a ring of a synthetic resin the same as or different from the first seal member and seals the space between the reinforcing plate 420 and the printed circuit board 400.

The reinforcing plate 420 has a drying nozzle 460 attached to it for feeding dry gas into the second air-tight space 424. As the dry gas to be introduced inside the second air-tight space 424, use may be made of dry air with a condensation temperature somewhat higher than the dry air introduced inside the first air-tight space 418, for example, about −40° C. The temperature of the dry air is about the room temperature. The condensation temperature of the dry air introduced inside the second air-tight space 424 may somewhat higher than the condensation temperature of the dry air introduced inside the first air-tight space 418 because the second air-tight space 424 is further away from the inside of the chamber 306 than the first air-tight space 418 and has a lower possibility of condensation.

Note that a space 430 is also formed between the seal ring 428 attached to the outer circumference of the socket adaptor 398 and the printed circuit board 400, but since the dry air inside the second air-tight space 424 is introduced into this space 430 through through holes formed in the printed circuit board 400, it is also possible to effectively prevent condensation at that portion.

In the electronic device testing apparatus 302 of the present embodiment, a heating board 406 is attached around the chamber opening 392 of the chamber 306 with an inside cooled to a temperature below ordinary temperature and the printed circuit board 400 is heated by heat conduction through the printed circuit board holding ring 414. Therefore, it is possible to effectively prevent condensation from occurring at the printed circuit board 400 behind the socket and the test head 310.

Further, in the IC chip testing apparatus 302 according to the present embodiment, since a special spacing frame or other heat insulating structure is not employed, it is possible to use general purpose printed circuit board holding rings 414 and other parts and the manufacturing costs become lower. Further, since it is no longer necessary to separate the printed circuit board 400 and the socket 320 by more than the necessary amount of distance, the electrical path from the sockets 320 to the printed circuit board 400 (electrical cables etc.) can be shortened, greater resistance to noise can be obtained, and the reliability of the tests can be improved.

Further, in the IC chip testing apparatus 302 according to this embodiment, by bringing the printed circuit board 400 into contact with the heating board 406 through a printed circuit board holding ring 414 so as to form a first air-tight space 418 at the printed circuit board side of the socket guide 382 and forming in the heating board 406 a drying passage 410 for feeding dry gas in the first air-tight space 418, the first air-tight space 418 can be filled with a dry gas. This enables condensation behind the socket guide 382 to be further effectively prevented.

Further, in the IC chip testing apparatus 302 of the present embodiment, by attaching a reinforcing plate 420 at the anti-chamber side of the printed circuit board 400 so as to form a second air-tight space 424 with the printed circuit board 400 and attaching to the reinforcing plate 420 a drying nozzle 460 for feeding dry gas into the second air-tight space 424, the second air-tight space 424 can also be filled with a dry gas. This enables condensation behind the printed circuit board 400 as well to be further effectively prevented.

Fourth Embodiment

Figure 13:
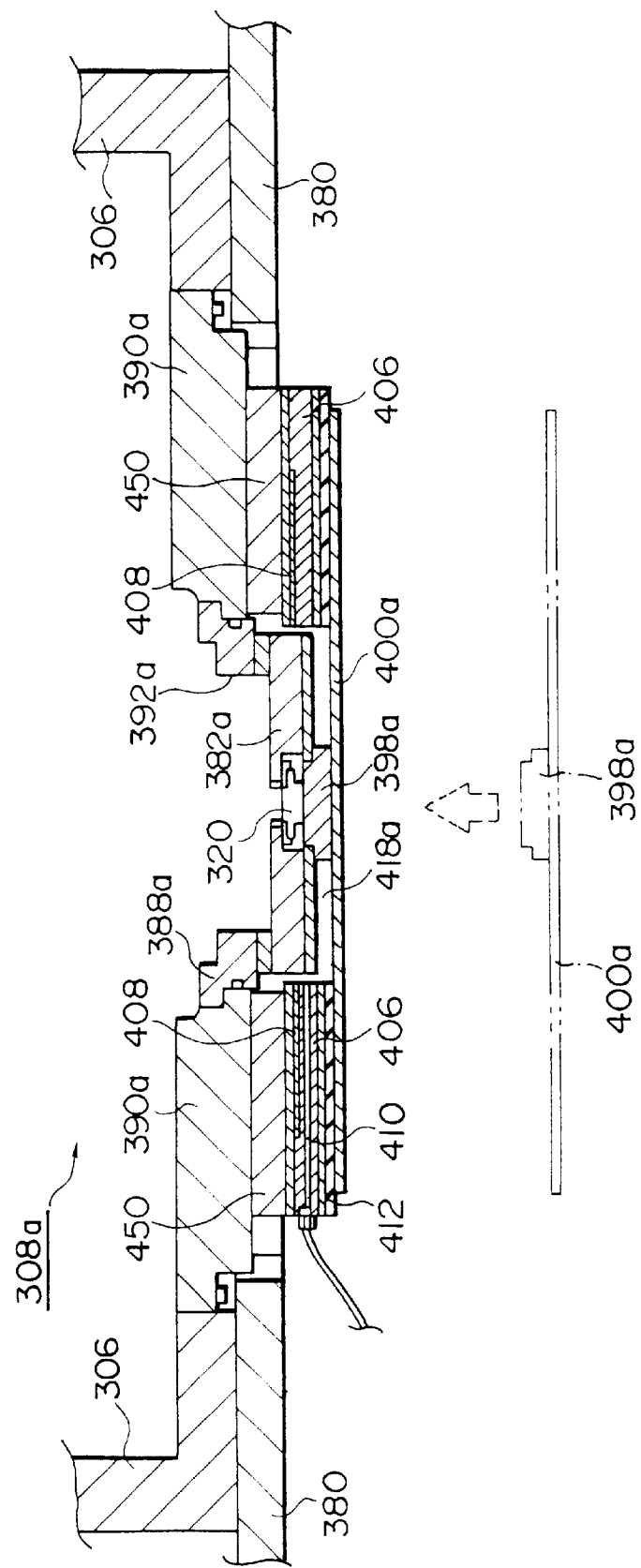
FIG. 13 is a sectional view of key parts of the IC chip testing apparatus according to another embodiment of the present invention.

As shown in FIG. 13, the test stage 308a of the testing apparatus according to this embodiment is configured so that the printed circuit board 400a constituting the test board is directly heated by the heating board 406. Below, only the points of difference from the testing apparatus according to the first embodiment will be explained. The explanation of common portions will be partially omitted.

The center of the mounting base 390a affixed to the bottom opening of the chamber 306 has attached to it a base ring 388a and forms the chamber opening 392a. A socket guide 382a is bolted etc. to the base ring 388a so that the socket 320 is positioned at the center of the chamber opening 392a.

Behind the mounting base 390a (outside of chamber) is bolted etc. a heating board 406 having an opening at its center through a mounting plate 450 serving also as a heating insulating member and a sealing member. The heating board 406 is also called an HIFIX heater and is comprised of a rubber heater or other planar heating element 408 sandwiched between aluminum sheets. The bottom surface of the heating board 406 has a first seal member 412 attached to it in advance. The first seal member 412 is comprised for example of a silicone sponge rubber sheet or other sheet having elasticity.

In the present embodiment, when connecting and affixing to the socket 320 the socket adapter 398a attached to the substantial center of the printed circuit board 400a serving as the test board, the surface of the outer circumference of the printed circuit board 400a comes into direct contact with the bottom of the heating board 406 through the first seal member 412 and the printed circuit board 400a is directly heated by the heating board 406.

The heating board 406 is formed with a radial drying passage 410. Dry gas can be filled into the first air-tight space 418a formed between the socket guide 382a and the printed circuit board 400a. As the dry gas for being filled inside the first air-tight space 418a, for example dry air having a condensation temperature lower than the temperature inside the chamber 306 may be used. For example, when the inside of the chamber 306 is about −55° C., the condensation temperature of the dry air sealed inside the first air-tight space 418a through the drying passage 410 is preferably about −60° C. The temperature of the dry air is for example about room temperature.

In the electronic device testing apparatus according to this embodiment, a heating board 406 is attached around the chamber opening 392a of the chamber 306 with an inside cooled to a temperature below ordinary temperature and the printed circuit board 400a is heated directly by heat conduction. Therefore, the printed circuit board 400a positioned behind the socket 320 is heated to a temperature above the dew point of the ambient gas. Therefore, it is possible to effectively prevent condensation from occurring at the printed circuit board 400a behind the socket.

Further, in the IC chip testing apparatus according to the present embodiment, since a special spacing frame or other heat insulating structure is not employed, the manufacturing costs become lower. Further, since the distance between the printed circuit board 400a and the sockets 320 becomes remarkably short, the electrical path from the sockets 320 to the printed circuit board 400a (electrical cables etc.) can be shortened, greater resistance to noise can be obtained, and the reliability of the tests can be improved.

Further, in the IC chip testing apparatus according to this embodiment, by bringing the printed circuit board 400a into contact with the heating board 406 so as to form a first air-tight space 418a at the printed circuit board side of the socket guide 382 and forming in the heating board 406 a drying passage 410 for feeding dry gas in the first air-tight space 418a, the first air-tight space 418a can be filled with a dry gas. This enables condensation behind the socket guide 382 to be further effectively prevented.

Other Embodiments

Note that the present invention is not limited to the above embodiments and can be changed in various ways within the scope of the invention.

For example, in the third and fourth embodiments, the explanation was mainly given of the case of conducting low temperature tests inside the chamber 306 shown in FIG. 10, but the present invention can also be applied even when conducting ordinary temperature tests inside the chamber 6. Further, the testing apparatus 2 shown in FIG. 10 is of a type enabling both ordinary temperature tests and high temperature tests as well in the chamber 6, but the testing apparatus according to the present invention can also be applied to a testing apparatus conducting only low temperature tests or a testing apparatus conducting only ordinary temperature tests. Further, in the testing apparatus according to the present invention, the method of handling the IC chips in the handler 4 is not limited to the illustrated embodiments.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An electronic device testing apparatus comprising:
   a socket to which an electronic device is brought into electrical contact,
   a circuit board with one terminal which is electrically connected to a terminal of a test head and with another terminal which is electrically connected to a terminal of the socket, and
   a heating element formed integrally with the circuit board.

2. The electronic device testing apparatus as set forth in claim 1, wherein the heating element is printed on the circuit board.

3. The electronic device testing apparatus as set forth in claim 1, wherein the circuit board is provided in proximity to the socket.

4. The electronic device testing apparatus as set forth in claim 3, wherein the heating element is provided in an area around where the socket is attached.

5. The electronic device testing apparatus as set forth in claim 1, wherein the heating element is formed as a heating element layer in a multiple layer structure of the circuit board.

6. The electronic device testing apparatus as set forth in claim 5, wherein the heating element layer is formed on the top surface of the circuit board and ground layers are formed above and below the heating element layer.

7. The electronic device testing apparatus as set forth in claim 5, wherein a temperature sensor is provided in an area where the heating element is provided so as to control a temperature of the heating element.

* * * * *